(12) United States Patent
Song et al.

(10) Patent No.: US 11,217,574 B2
(45) Date of Patent: Jan. 4, 2022

(54) LIGHT-EMITTING DIODE (LED) MODULE AND DEVICE INCLUDING THE SAME

(71) Applicant: SAMSUNG ELECTRONICS CO., LTD., Suwon-si (KR)

(72) Inventors: Jongsup Song, Suwon-si (KR); Tetsuo Ariyoshi, Suwon-si (KR); Taehyun Lee, Suwon-si (KR); Seolyoung Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/848,592

(22) Filed: Apr. 14, 2020

(65) Prior Publication Data

US 2021/0043614 A1  Feb. 11, 2021

(30) Foreign Application Priority Data

Aug. 7, 2019 (KR) .................. 10-2019-0096346

(51) Int. Cl.
*H01L 25/16* (2006.01)
*H01L 33/58* (2010.01)
*H01L 33/50* (2010.01)
*G02B 3/08* (2006.01)

(52) U.S. Cl.
CPC .......... *H01L 25/167* (2013.01); *H01L 33/502* (2013.01); *H01L 33/58* (2013.01); *G02B 3/08* (2013.01)

(58) Field of Classification Search
CPC ..... H01L 25/167; H01L 33/58; H01L 33/502; G02B 3/08
See application file for complete search history.

(56) References Cited

U.S. PATENT DOCUMENTS

| 7,859,193 | B2 | 12/2010 | Fukasawa |
| 10,120,266 | B2 | 11/2018 | Butterworth |
| 2008/0199127 | A1 | 8/2008 | Lowles |
| 2014/0051955 | A1* | 2/2014 | Tiao ................... A61B 5/14552 600/323 |
| 2016/0240721 | A1* | 8/2016 | Chu ....................... G01J 1/0437 |
| 2017/0122800 | A1 | 5/2017 | Costello et al. |
| 2018/0175264 | A1* | 6/2018 | Lee ......................... H01L 33/58 |
| 2020/0217713 | A1* | 7/2020 | Wang .................... G01J 1/4204 |

FOREIGN PATENT DOCUMENTS

| KR | 1020120066455 A | 6/2012 |
| KR | 101583613 B1 | 1/2016 |
| KR | 1020180019393 A | 2/2018 |

* cited by examiner

*Primary Examiner* — Jay C Chang
*Assistant Examiner* — Mikka Liu
(74) *Attorney, Agent, or Firm* — Volentine, Whitt & Francos, PLLC

(57) ABSTRACT

A light emitting diode (LED) module includes a substrate, an LED package, a light sensor and a lens. The LED package includes a light emitting region and is mounted on an upper surface of the substrate. The light sensor includes a light receiving region and is mounted on the upper surface of the substrate horizontally adjacent the LED package. The lens is vertically aligned over the light emitting region of the LED package and at least partially overlaps the light receiving region of the light sensor.

17 Claims, 13 Drawing Sheets

I2-I2'

LIGHT-EMITTING DIODE (LED) MODULE AND DEVICE INCLUDING THE SAME

CROSS-REFERENCE TO RELATED APPLICATION(S)

A claim of priority is made to Korean Patent Application No. 10-2019-0096346 filed on Aug. 7, 2019, in the Korean Intellectual Property Office, the disclosure of which is herein incorporated by reference in its entirety.

BACKGROUND

Example embodiments of the present inventive concept relate to light emitting diode (LED) modules equipped with a flash LED and a light sensor, and to electronic devices including the same.

Incandescent flash light bulbs have long been used in conjunction with cameras to illuminate an object to be photographed in low illumination settings. These bulbs have largely been replaced with light emitting diodes (LEDs) (called "flash LEDs" herein) in modern digital camera devices, such as those embedded in mobile phones. In addition, and separately, modern digital camera devices may also be equipped with an ambient light sensor that is used for calibration of camera parameters to enhance the quality of an image captured by the camera.

In the meantime, industry demands continue to require miniaturization of components utilized in electronic devices. Such demands apply in camera design as well, particularly in the case of cameras embedded in mobile products such as mobile phones. While the inclusion of a flash LED and ambient light sensor in a camera design provides photographic benefits, these components take up valuable space in the limited available footprint for camera components.

SUMMARY

According to an aspect of the present inventive concept, a light emitting diode (LED) module is provided which includes a substrate, an LED package, a light sensor and a lens. The LED package includes a light emitting region and is mounted on an upper surface of the substrate. The light sensor includes a light receiving region and is mounted on the upper surface of the substrate horizontally adjacent the LED package. The lens is vertically aligned over the light emitting region of the LED package and at least partially overlaps the light receiving region of the light sensor.

According to another aspect of the present inventive concept, a light emitting diode (LED) module is provided which includes a substrate, an LED package, an ambient light sensor and a module cover. The LED package includes a light emitting region and is mounted on an upper surface of the substrate. The ambient light sensor includes a light receiving region and is mounted on the upper surface of the substrate horizontally adjacent the LED package. The module cover is formed of light transparent material and extends over the substrate to define an upper wall of the LED module, and a portion of the module cover includes a Fresnel lens vertically aligned over the light emitting region LED package and at least partially overlapping the light receiving region of the ambient light sensor. The LED package includes an LED chip and a wavelength conversion film located over the LED chip. The LED package further includes a reflective structure having vertical reflective sidewalls surrounding the LED chip and wavelength conversion film to inhibit light emission from side surfaces of the LED chip and wavelength conversion film.

According to still another aspect of the inventive concepts, a light emitting diode (LED) module is provided which includes a substrate, an LED package and a module cover. The LED package includes a light emitting region and is mounted on the upper surface of the substrate. The module cover is formed of a transparent material and extends over the substrate to define an upper wall of the LED module, and a portion of the module cover includes a lens aligned over the light emitting region of the LED package. A lower surface of at least the lens of the module cover is roughened to form a visual impediment against viewing the LED package through the lens from outside the module cover.

According to yet another embodiment of the inventive concepts, an electronic device is provided which includes a camera lens, a light emitting diode (LED) module, a lens and an outer casing. The LED module include an LED package and an ambient light sensor mounted horizontally adjacent to each other on a substrate. The lens is aligned over the LED package and at least partially overlaps the ambient light sensor, and the outer casing includes a light transparent region. The LED package is operative to emit light through the lens and the light transparent region, and the ambient light sensor is operative to sense light through the lens and the light transparent region. The light sensor is configured to receive an ambient light to produce information relating to flicker, color, and/or brightness, and the electronic device is configured to correct a camera image or control a light output of the LED package based on the information.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
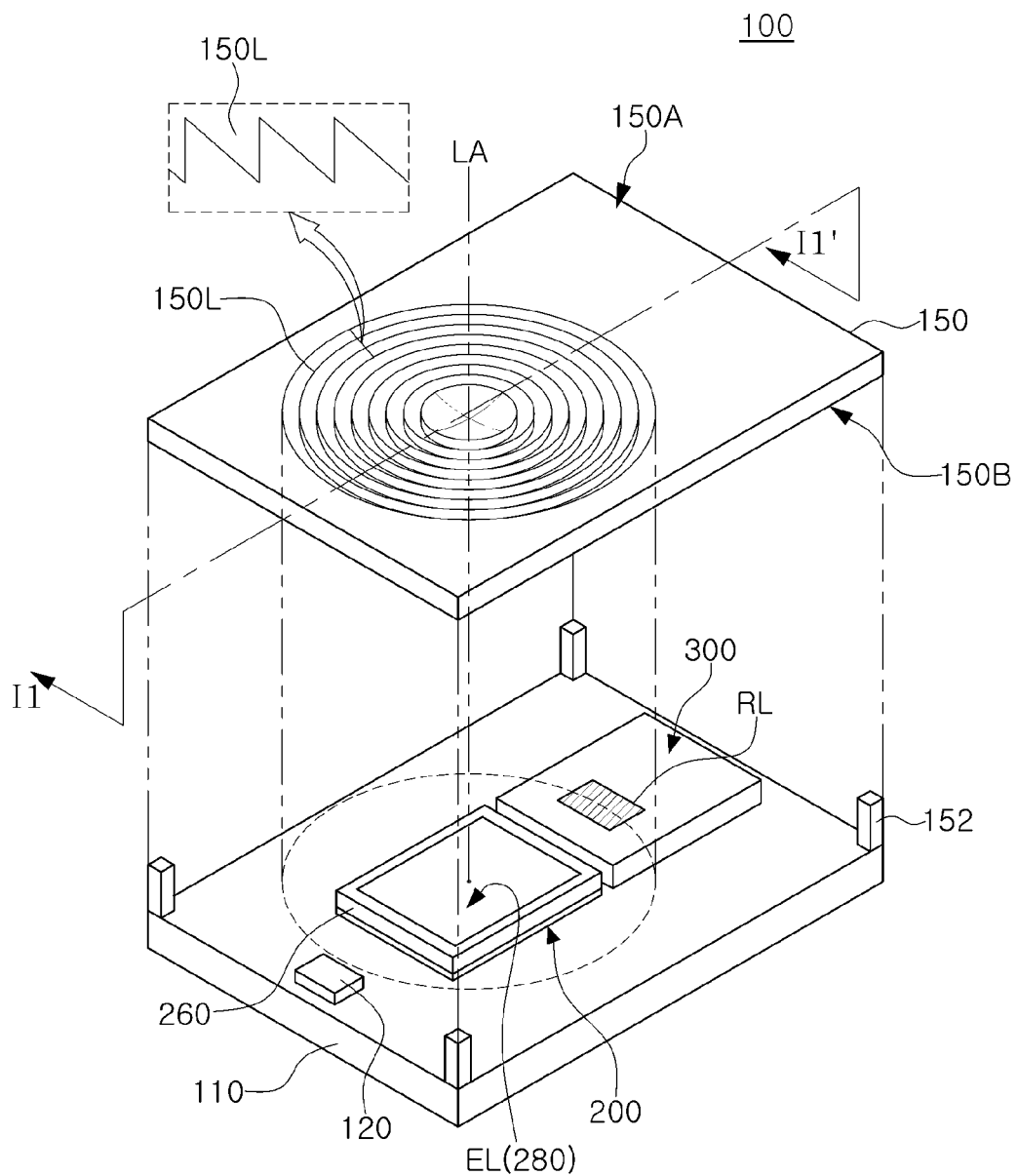
FIG. 1 is an exploded perspective diagram illustrating a flash LED module according to an example embodiment of the present inventive concept.

Hereinafter, embodiments of the present inventive concept will be described with reference to the accompanying drawings.

Throughout the description, relative locations of components are described using terms such as "upper", "lower", "above", "below", "vertical", "horizontal" and the like. These terms are for descriptive purposes only, and are intended only to describe the relative locations of components assuming the orientation of the overall device is that same as that shown in the drawings. The embodiments, however, are not limited to illustrated device orientations.

Figure 2A:
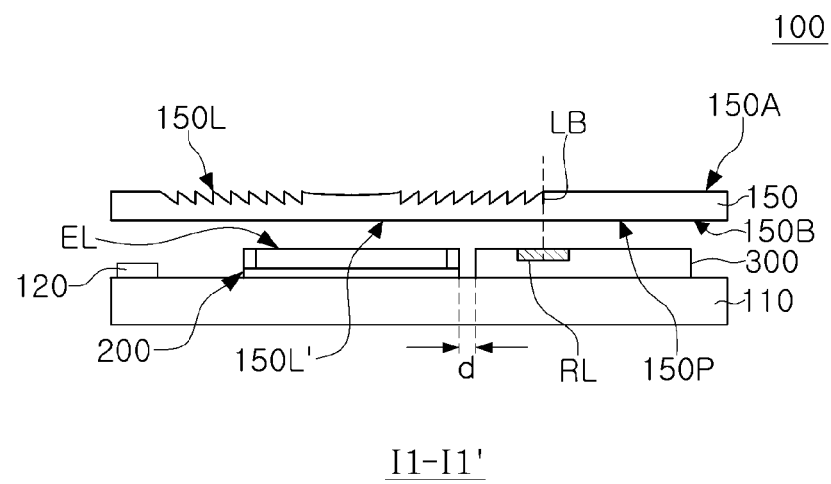
FIG. 2A is a cross-sectional diagram illustrating the flash LED module (in an assembled state) illustrated in FIG. 1.

FIG. 1 is an exploded perspective diagram illustrating a flash LED module according to an example embodiment. FIG. 2A is a cross-sectional diagram illustrating the flash LED module (an assembled state) illustrated in FIG. 1.

Referring collectively to FIGS. 1 and 2A, a flash LED module 100 in the example embodiment may include a substrate 110, an LED package 200 and a light sensor 300. As shown, the LED package 200 and the light sensor 300 may be disposed horizontally adjacent to each other on an upper surface or surfaces of the substrate 110. The flash LED module 100 may further include a module cover 150 disposed over the substrate 110 so as to cover the LED package 200 and the light sensor 300. The module cover 150 may be formed of a light transparent material, and may define an upper wall of the flash LED module 100.

The substrate 110 may be implemented as a printed circuit board (PCB), a metal core PCB (MCPCB), a metal PCB (MPCB), a flexible PCB (FPCB), or the like, and the LED package 200 and the light sensor 300 may be electrically connected to one or more circuits of the substrate 110. In example embodiments, one or more additional devices 220 (such as a circuit protective Zener diode) may be mounted on the substrate 110. In addition, although the substrate 110 is illustrated as a single continuous layer in the figures, the inventive concepts are not limited in this manner. In other embodiments, the substrate 110 may be a multilayer structure. Further, although the substrate 110 is illustrated as having a continuous and planar top surface, the inventive concepts are not limited in this manner. In other embodiments, the substrate 110 may have a non-planar upper surface and/or may include physically segregated upper surface sections (e.g., with a trench, step or wall there between), and the LED package 200 and the light sensor 300 may be disposed on the same or different ones of these physically segregated upper surface sections. In other embodiments, the upper surface sections having the LED package 200 and the light sensor 300 respectively disposed thereon may not be coplanar. In other words, one of the LED package 200 and the light sensor 300 may be vertically elevated relative to the other.

The LED package 200 may include one or more LED chips (not illustrated). Here, it is noted that the term "flash" in phrases such as "flash LED module" has no particular structural meaning beyond the LED chip(s) thereof having the capacity to function as the light flash of a camera. That is, it will be understood "flash" is a term directed to relative light emission capacity rather than structure.

Side surfaces of the LED package 200 may be surrounded by vertical sidewalls of a reflective structure 260. A light emitting region EL (FIG. 2A) of the LED package 200 may be an upper surface of the LED package 200 surrounded by the reflective structure 260. The LED package 200 may include an LED chip and a wavelength conversion element which are configured to emit white light. A more detailed description of examples of the LED package 200 will be provided later with reference to FIGS. 3A and 3B.

The light sensor 300 may have a light receiving region RL for receiving light, and may be disposed horizontally adjacent to the LED package 200. The light receiving region RL may include a photodiode array. The light sensor 300 may be an ambient light sensor, in which case the light receiving region RL receives ambient light. The light sensor 300 may sense other aspects of a sensed environment, such as infrared (IR) energy and flicker.

As an example, when a camera captures an image in a low illumination environment, the LED package 200 of the flash LED module 100 may operate to emit a flash of light. Separately, the light sensor 300 may operate to receive ambient light and provide corresponding information that is used to correct the image captured by the camera.

In the example embodiment, a vertical wall of the reflective structure 260 may interposed between the LED package 200 and the light sensor 300 so as prevent or inhibit light emitted by the LED package 200 from reaching to the light sensor 300 adjacent to the LED package 200. The reflective structure 260 may be formed of a resin material including a reflective powder. For example, the resin material may include silicone or an epoxy. The reflective powder may be a white ceramic powder or a metal powder. Examples of the white ceramic powder include at least one of $TiO_2$, $Al_2O_3$, $Nb_2O_5$, or ZnO. Examples of the metal powder include Al or Ag.

The module cover 150 may cover the LED package 200 and the light sensor 300, and may have a lens 150L included therein in a region overlapping the light emitting region EL. In an embodiment, and as shown in the figures, the lens 150L constitutes an integral part of the module cover 150, and the module cover 150 including the lens 150L may be a one-piece structure. The lens 150L may be vertically aligned over the light emitting region EL of the LED package 200, and as shown in the drawings, an optical center axis LA of the lens 150L may be vertically aligned with a geometric center of the light emitting region EL. In the example embodiment, the module cover 150 may have a flat rectangular shape with the lens 150L located therein, and may be supported by side wall structures 152 such as a posts protruding upwardly from a surface of the substrate 110. However, the structure and shape of the module cover 150 may be varied.

A lower surface region 150L' (FIG. 2B) of the lens 150L may be provided as a light incident region in which light emitted by the light emitting region EL of the LED package 200 is incident on a lower surface of the module cover 150. The lens 150L may be configured to uniformly distribute the light incident from the light emitting region EL over a wide angle. In example embodiments, the lens 150L may be configured as a Fresnel lens. For example, a field-of-view (FOV) of the lens 150L may be 100° or higher, or 120° or higher. As represented by the dashed-circle of FIG. 1, a horizontal area of the lens 150L may be greater than a surface area of the light emitting region EL of the LED package 200 such that the lens 150L entirely overlaps the light emitting region EL.

In addition, as shown in FIGS. 1 and 2A, the horizontal area of the lens 150L may be such that at least a portion of the light receiving region RL of the light sensor 300 is overlapped by the lens 150L. Accordingly, when a boundary line LB along the outer edge of the lens 150L is extended in a direction perpendicular to the substrate 110, the boundary line LB may be disposed in the light receiving region RL.

FIG. 2A shows a gap d which is a horizontal spacing between the light sensor 300 and the LED package 200. The gap d may, for example, be 300 μm or less (alternatively, 200 μm or less). The light receiving region RL of the light sensor 300 may receive light incident through the lens 150L. That is, in the arrangement of the present embodiment, the lens 150L may be aligned with an optically transparent opening (called a transparent hole herein) in the housing of a device (e.g., smart phone) containing LED module 100. In that case, flash light emitted by the LED package 200 may be projected through and ambient light detected by the light sensor 300 may be received through the same transparent hole in a housing of the device.

Figure 2B:
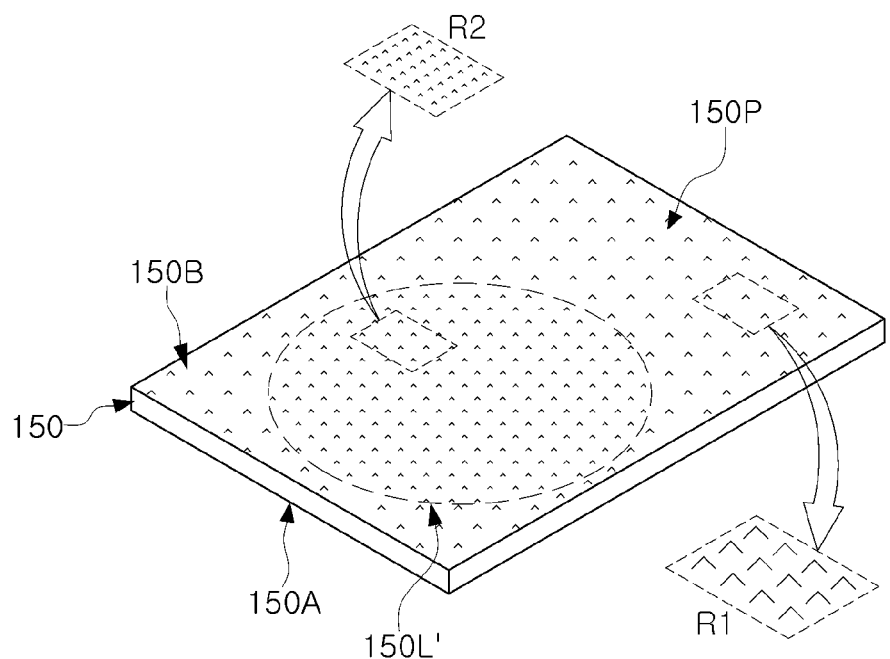
FIG. 2B is a perspective diagram illustrating a module cover of the flash LED module illustrated in FIG. 1.

In the arrangement, the LED package 200 and the light sensor 300 disposed below the module cover 150 may be visually exposed through the module cover 150, which may be aesthetically undesirable. As represented in FIG. 2B, this can be prevented or mitigated by roughening a lower surface 150B of the module cover 150 to visually create a frost-like effect across the lower surface 150B that acts as a visual impediment to viewing of elements below the module cover 150. In addition, the level of roughness may vary depending on location across the lower surface 150B. For example, FIG. 2B illustrates lower surface region 150L' of the module cover 150 that constitutes a lower surface of the lens 150L, and a remaining lower surface region 150P of the module cover 150. The lower surface region 150L' may have a surface roughness R2 that is different than a surface roughness R1. Since the roughening may lessen the amount of light transmitted through the module cover 150, in embodiments the surface roughness R2 of the lower surface region 150L' may be less than the surface roughness R1 of the remaining surface region 150P. As examples, an arithmetic mean surface roughness value (R2) of the lower surface region 150L' of the lens 150L of the module cover 150 may be in a range of 0.1 μm to 1.0 μm, and an arithmetic mean surface roughness value (R1) of the remaining lower surface region 150P of the module cover 150 may be 0.8 μm or more. Here, arithmetic mean surface roughness is typically denoted "Ra" and denotes the arithmetic average of the absolute values of profile height deviations from a mean height line along a length of the surface.

In example embodiments, surface roughening may also or instead be applied to an upper surface 150A of the module cover 150. An example of this will be described later in connection with FIG. 8.

The module cover 150 may be formed of a transparent material, such as a light transmitting resin, and may be fabricated using a mold. In this case, the module cover 150 having the above-described surface roughness may be realized by forming serrations of an appropriate surface roughness in each region along with an engraved structure corresponding to a Fresnel lens on a surface of the mold.

Figure 3A:
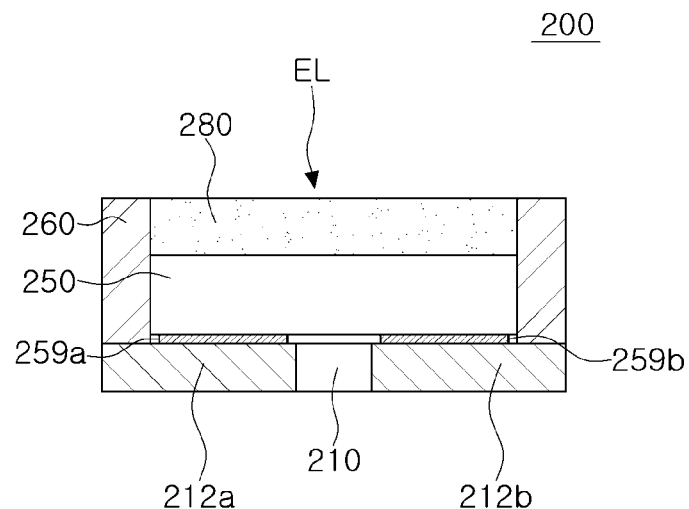
FIGS. 3A and 3B are cross-sectional diagrams illustrating LED devices employable in a flash LED module according to an example embodiment of the present inventive concept.
Figure 3B:
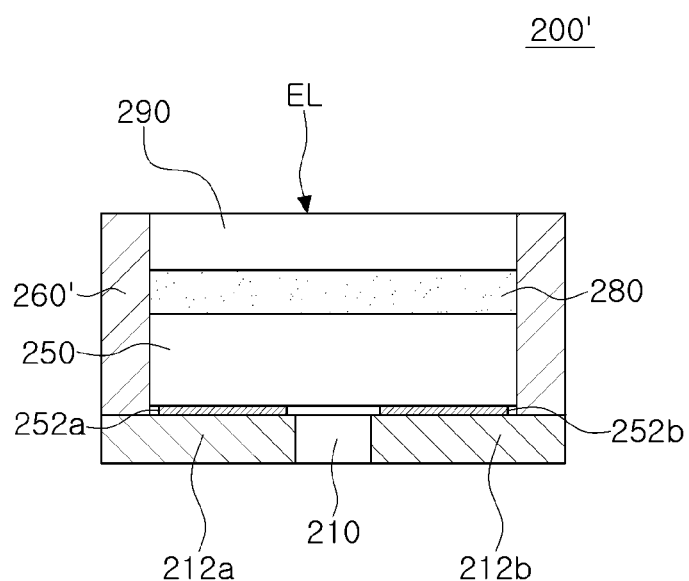

FIGS. 3A and 3B are cross-sectional diagrams illustrating two types of LED devices employable in a flash LED module according to an example embodiment. However, the inventive concepts are not limited to the examples of FIGS. 3A and 3B.

Referring to FIG. 3A, an LED package 200 in the example embodiment may include a wiring substrate 210, an LED chip 250 and a wavelength converting film 280. The wiring substrate 210 may include first and second wiring electrodes 212a and 212b. The LED chip 250 may be mounted on the wiring substrate 210 such that first and second electrode pads 259a and 259b of a lower surface of the LED chip are connected to the first and second wiring electrodes 212a and 212b, respectively, of the wiring substrate 210. The wavelength converting film 280 may be disposed on an upper surface of the LED chip 250. The LED chip 250 and wavelength converting film 280 may be configured to emit white light.

As described previously, the LED package 200 in the example embodiment may be surrounded by a reflective structure 260. As shown in FIG. 3A, the reflective structure 260 includes vertical sidewalls which may surround side surfaces of the LED chip 250 and side surfaces of the wavelength converting film 280. The reflective structure 260 may prevent or minimize light emitted by the LED package 200 from adversely impacting an operation of the light sensor 300 disposed adjacent thereto.

The wiring substrate 210 may include an insulating resin and a ceramic substrate. The first and second wiring electrodes 212a and 212b may include a metal such as Au, Cu, Ag, and Al. The first and second electrode pads 259a and 259b of the LED chip 250 may be connected to the first and second wiring electrodes 212a and 212b through solder balls. The LED package 200 illustrated in FIG. 3A may be configured as a chip scale package, and a wiring structure may be directly formed on the first surface of the LED chip 250 using a wafer level fabrication process.

The wavelength converting film 280 may include at least one type of a wavelength conversion material for converting a portion of light emitted from the LED chip 250 into light having a given wavelength which is different from a wavelength of the emitted light. The wavelength converting film 280 may be configured as a resin layer on which the wavelength conversion material is distributed, or a ceramic fluorescent film. For example, the wavelength conversion material may be at least one of a fluorescent material and a quantum dot.

For example, the LED package 200 may be configured to emit white light. In example embodiments, the LED chip 250 may emit blue light. For example, the LED chip 250 may emit light having a primary wavelength of 440 nm to 460 nm. The wavelength conversion material may include a fluorescent material or a quantum dot which convers a portion of blue light into yellow light, or may include a plurality of fluorescent materials or a plurality of quantum dots converts a portion of blue light into red light and green light.

FIG. 3B illustrates an LED package 200' in another example embodiment. This embodiment is similar to the example illustrated in FIG. 3A, except that the LED package 200' further includes a light transmitting film 290 having a low refractive index.

That is, the LED package 200' may further include a light transmitting film 290 disposed on the wavelength converting film 280. In this case, a reflective structure 260' may be configured to further surround the light transmitting film 290 along with the LED chip 250 and the wavelength converting film 280. In the example embodiment, the reflective structure 260' may be configured to have a height that is higher than an upper surface of the wavelength converting film 280, thereby increasing an efficiency of condensing light to the lens 150L (in FIG. 1). By including the light transmitting film 290 having a low refractive index, light extraction efficiency may increase.

The flash LED packages 200 and 200' employed in the example embodiments may have a flip chip structure in which a surface on which the light emitting region EL is provided may be configured to oppose a surface on which electrodes are formed. The flash LED packages 200 and 200' may include a reflective structure 260 surrounding at least the LED chip 250 and the wavelength converting film 280 to easily condense light emitted from the LED chip 250. In example embodiments, the LED package 200 may be configured as a compact chip scale package.

Figure 4A:
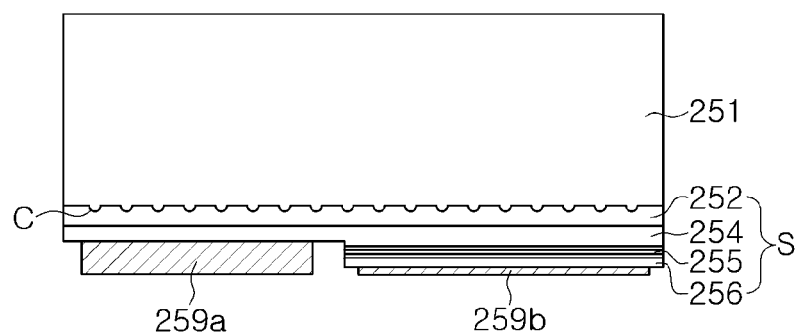
FIGS. 4A and 4B are cross-sectional diagrams illustrating semiconductor LED chips employable in a flash LED module according to an example embodiment of the present inventive concept.
Figure 4B:
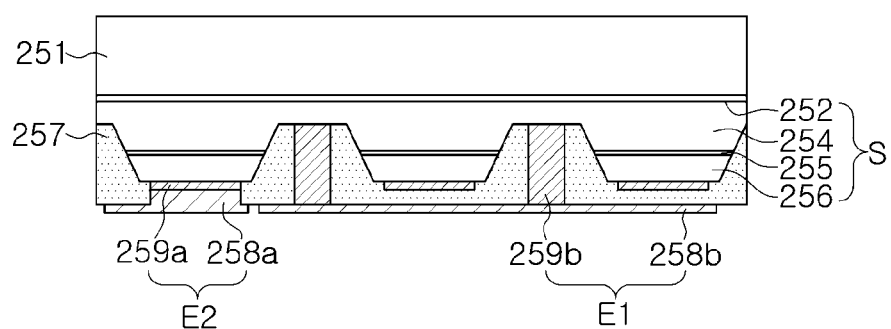

The LED package 200 (and '200) may include various type of LED chips in a variety of package structures. FIGS. 4A and 4B are cross-sectional diagrams illustrating two examples of LED chips.

Referring to FIG. 4A, a LED chip 250A may include a substrate 251, and a semiconductor stack structure S having a first conductivity-type semiconductor layer 252, an active layer 255, and a second conductivity-type semiconductor layer 256. A buffer layer 252 may be disposed between the substrate 251 and the first conductivity-type semiconductor layer 254.

The substrate 251 may be configured as an insulating substrate such as a sapphire substrate. However, an example embodiment thereof is not limited thereto. The substrate 251 may be configured as a conductive substrate or a semiconductor substrate other than an insulating substrate. For example, the substrate 251 may be formed of SiC, Si, MgAl2O4, MgO, LiAlO2, LiGaO2, and GaN, other than sapphire. Serrations C may be formed on an upper surface of the substrate 251. The serrations C may improve light extraction efficiency and may improve the quality of a grown single crystal.

The buffer layer 252 may be $In_xAl_yGa_{1-x-y}N$ ($0 \leq x \leq 1$, $0 \leq y \leq 1$). For example, the buffer layer 252 may be formed of GaN, AlN, AlGaN, and InGaN. If desired, the buffer layer 252 may formed by combining a plurality of layers, or may include a plurality of layers in which a portion of compositions of the layers are gradually changed.

The first conductivity-type semiconductor layer 254 may be formed of a nitride semiconductor satisfying n-type $In_xAl_yGa_{1-x-y}N$ ($0 \leq x < 1$, $0 \leq y < 1$, $0 \leq x+y < 1$), and the n-type impurity may be Si. For example, the first conductivity-type semiconductor layer 254 may include n-type GaN. The second conductivity-type semiconductor layer 256 may be formed of a nitride semiconductor layer satisfying p-type $In_xAl_yGa_{1-x-y}N$ ($0 \leq x < 1$, $0 \leq y < 1$, $0 \leq x+y < 1$), and the p-type impurity may be Mg. For example, the second conductivity-type semiconductor layer 256 may have a single layer structure, but as in the example embodiment, the second conductivity-type semiconductor layer 256 may include multiple layers having different compositions.

The active layer 255 may have a multiple quantum well MQW structure in which a quantum well layer and a quantum wall layer are alternately layered. For example, the quantum well layer and the quantum wall layer may be $In_xAl_yGa_{1-x-y}N$ ($0 \leq x \leq 1$, $0 \leq y \leq 1$, $0 \leq x+y \leq 1$), and may have different compositions. In an example embodiment, the quantum well layer may be $In_xGa_{1-x}N$ ($0 < x \leq 1$), the quantum wall layer may be GaN or AlGaN. Thicknesses of the quantum well layer and the quantum wall layer may be within a range of 1 nm to 50 nm. The active layer 255 may not be limited to a multiple quantum well structure, and may have a single quantum well structure.

The first and second electrode pads 259a and 259b may be disposed on a mesa-etched region of the first conductivity-type semiconductor layer 254 and the second conductivity-type semiconductor layer 256. The first electrode 259a may include elements such as Ag, Ni, Al, Cr, Rh, Pd, Ir, Ru, Mg, Zn, Pt, Au, and the like, but a material of the first electrode pad 259a is not limited thereto. The first electrode pad 259a may have a single layer or two or more layers. If desired, the second electrode pad 259b may be configured as a transparent electrode formed of a transparent conductive oxide or a transparent conductive nitride, and may include graphene. The second electrode pad 259b may include at least one of Al, Au, Cr, Ni, Ti, and Sn.

FIG. 4B is a cross-sectional diagram illustrating an example of a different type of a semiconductor LED employable in the example embodiments.

Referring to FIG. 4B, a semiconductor LED chip 250B may include a substrate 251, and a semiconductor stack structure S disposed on the substrate 251. The semiconductor stack structure S may include a buffer layer 252, a first conductivity-type semiconductor layer 254, an active layer 255, and a second conductivity-type semiconductor layer 256.

The semiconductor LED chip 250B may include first and second electrode structures E1 and E2 connected to the first and second conductivity-type semiconductor layers 254 and 256. The first electrode structure E1 may include a connection electrode 258a, such as a conductive via, penetrating the second conductivity-type semiconductor layer 256 and the active layer 255 and connected to the first conductivity-type semiconductor layer 254, and a first electrode pad 259b connected to the connection electrode 258a. The connection electrode 258a may be surrounded by an insulating portion 257 and may be electrically isolated from the active layer 255 and the second conductivity-type semiconductor layer 256. The connection electrode 258a may be disposed on a region in which the semiconductor stack structure S is etched. The number, a shape, a pitch, a contact area with the first conductivity-type semiconductor layer 254 of the connection electrode 258a may be appropriately configured to decrease contact resistance. The connection electrode 258a may be arranged on the semiconductor stack structure S to form a row and a column, thereby improving current flow. The second electrode structure E2 may include an ohmic contact layer 258b disposed on the second conductivity-type semiconductor layer 256 and a second electrode pad 259b.

The connection electrode 258a and the ohmic contact layer 258b may include the first and second conductivity-type semiconductor layers 254 and 256 and a single layer or multiple layers formed of a conductive material having ohmic properties. For example, the connection electrode 258a and the ohmic contact layer 258b may include materials such as Ag, Al, Ni, Cr, a transparent conductive oxide (TCO), and the like.

The first and second electrode pads 259a and 259b may be connected to the connection electrode 258a and the ohmic contact layer 258b, respectively, and may work as an external terminal of the LED chip 250B. For example, the first and second electrode pads 259a and 259b may be formed of Au, Ag, Al, Ti, W, Cu, Sn, Ni, Pt, Cr, NiSn, TiW, or AuSn, or eutectic metals thereof. The first and second electrode structures E1 and E2 may be disposed in the same direction.

Figure 5:
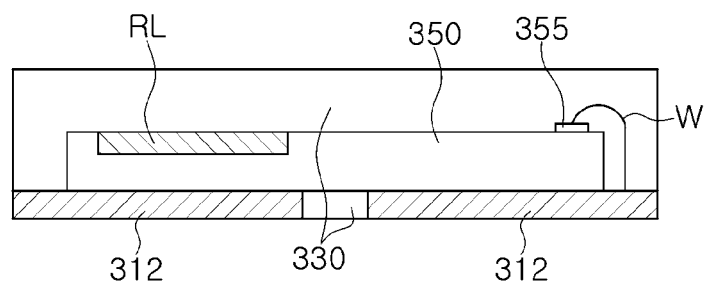
FIG. 5 is a plan diagram illustrating a light sensor employable in a flash LED module according to an example embodiment of the present inventive concept.
Figure 6:
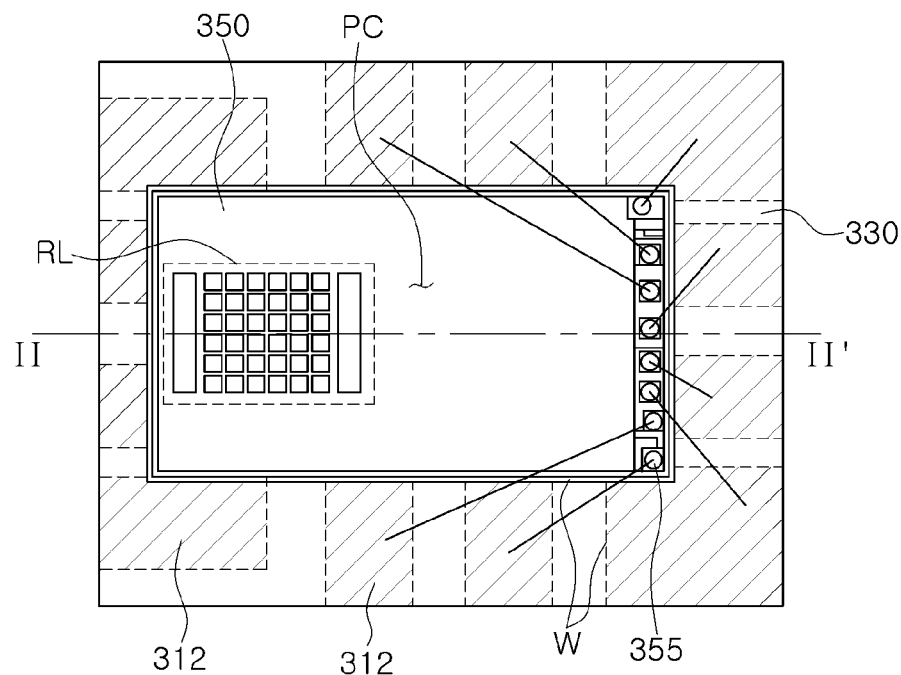
FIG. 6 is a plan diagram of the light sensor illustrated in FIG. 5.

FIG. 5 is a plan diagram illustrating a light sensor employable in a flash LED module according to an example embodiment, and FIG. 6 is a plan diagram illustrating the light sensor illustrated in FIG. 5.

Referring to FIGS. 5 and 6, a light sensor 300 in the example embodiment may include a lead frame 312, a light sensor chip 350 disposed on the lead frame 312, and a transparent resin layer 330 disposed on the lead frame 312 and encapsulating the light sensor chip 350. The light sensor chip 350 may include a plurality of terminals 355, and the plurality of terminals 355 may be connected to the lead frame 312 by a wire W.

As illustrated in FIG. 6, the light sensor chip 350 may include a light receiving region RL disposed on an upper surface adjacent to one side corner, and a peripheral circuit region PC disposed in the other region of the upper surface. The light receiving region RL may include a photodiode array, and the peripheral circuit region PC may include a circuit device such as a transistor.

Figure 7A:
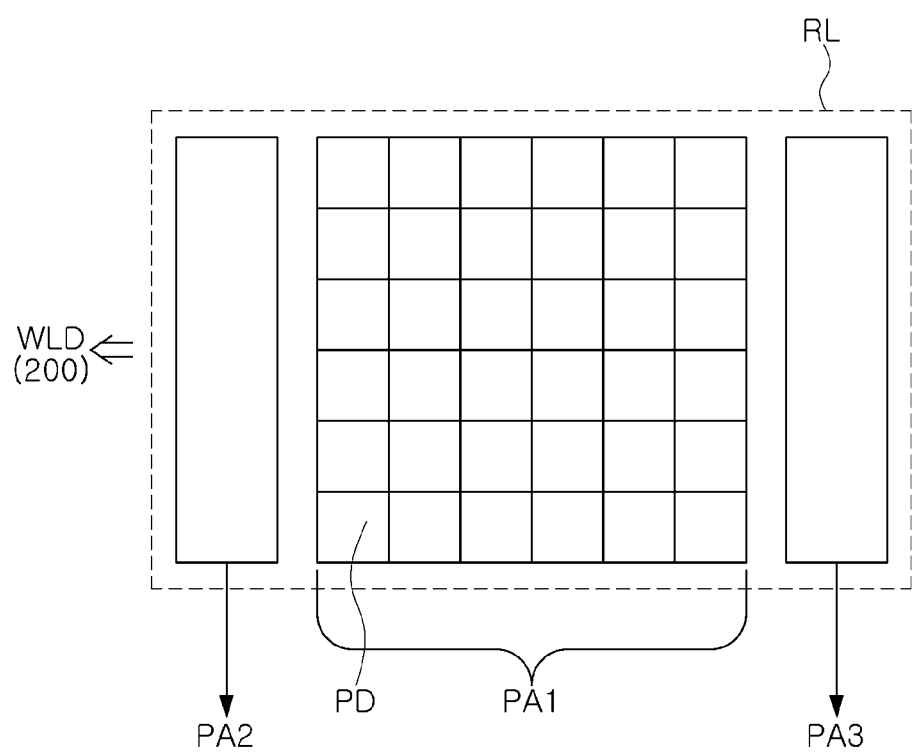
FIG. 7A is a diagram of a layout of a light receiving region of the light sensor illustrated in FIG. 5.
Figure 7B:
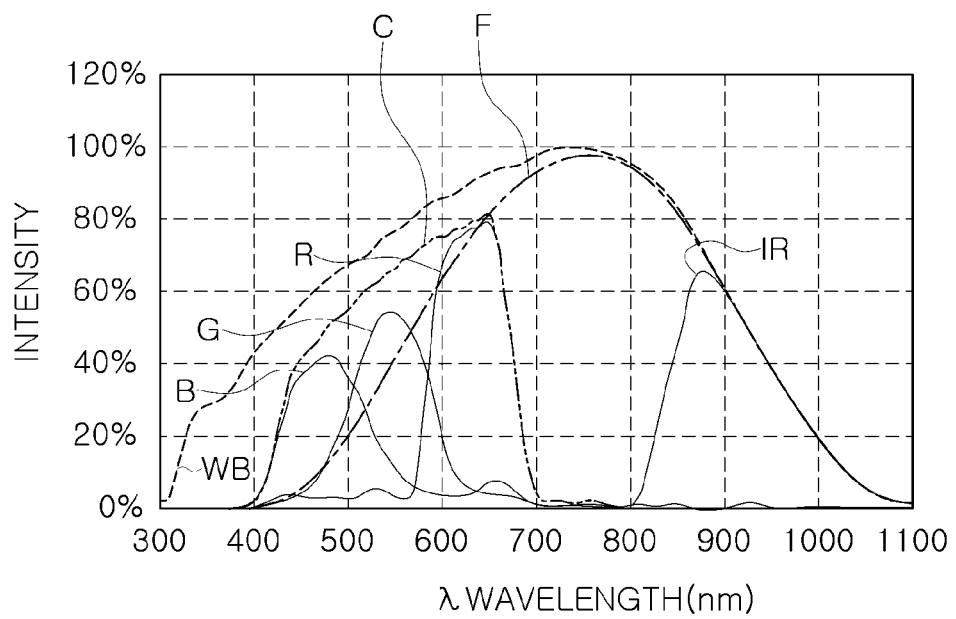
FIG. 7B is a diagram of spectrums of light detected from the light receiving region illustrated in FIG. 7A.

FIG. 7A is a diagram illustrating a layout of a light receiving region RL of the light sensor illustrated in FIG. 5, and FIG. 7B is a diagram illustrating a spectrum of light detected from the light receiving region illustrated in FIG. 7A.

As illustrated in FIG. 7A, the light receiving region RL of the light sensor 300 may include a plurality of photodiode cells PD, and may include a first region PA1 sensing visible light, a second region PA2 sensing flicker, and a third region PA3 sensing infrared light. The first to third regions PA1 to PA3 of the light receiving region RL may detect light having the spectrums illustrated in FIG. 7B.

For example, referring to FIGS. 7A and 7B, a photodiode cell PD in the first region PA1 may sense red light R, green light G, and blue light B, and may also sense a wide band W and a clear band C. The photodiode cells in the second and third regions PA2 and PA3 may sense flicker (F) and infrared light (IR).

Figure 8:
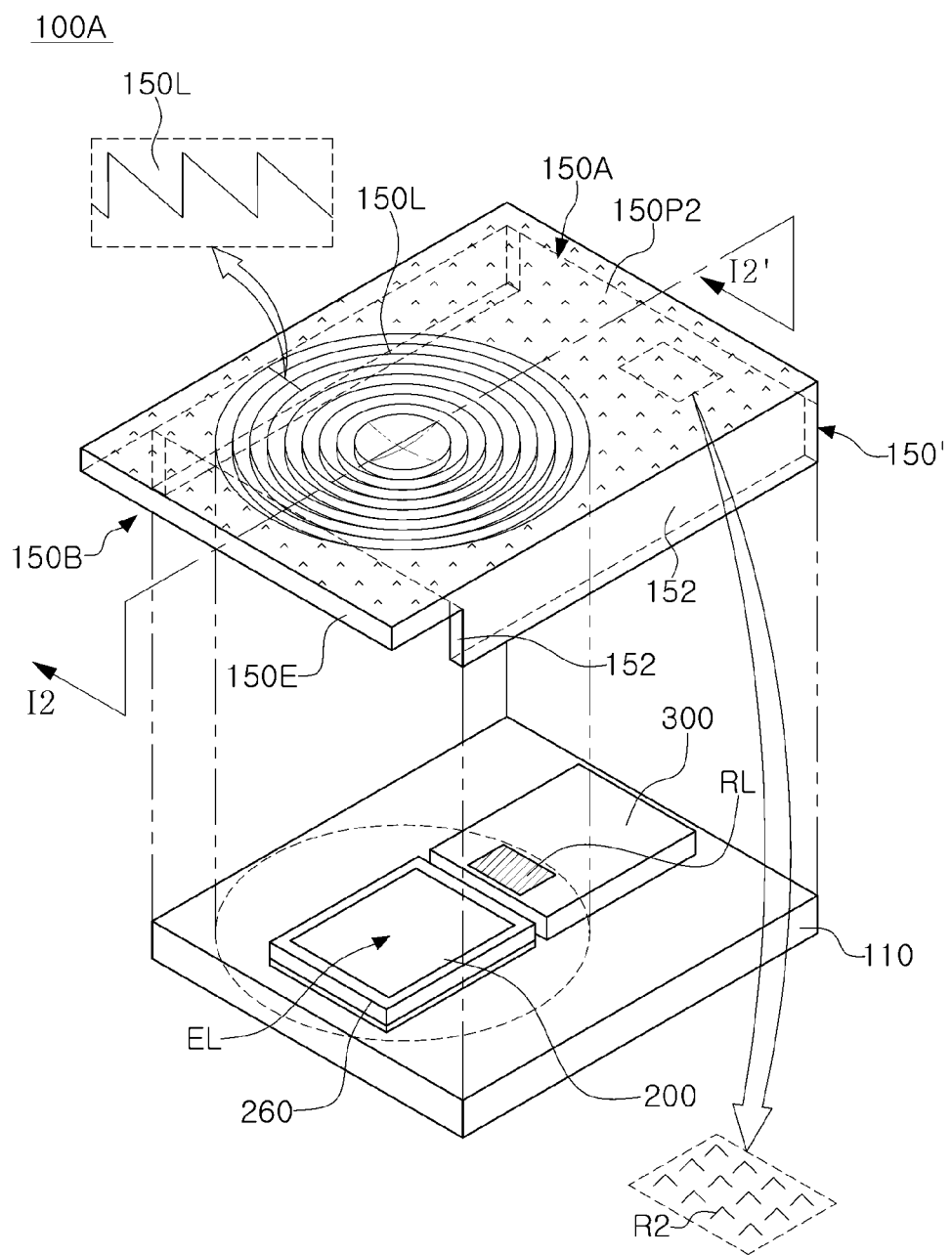
FIG. 8 is an exploded perspective diagram illustrating a flash LED module according to an example embodiment of the present inventive concept.
Figure 9A:
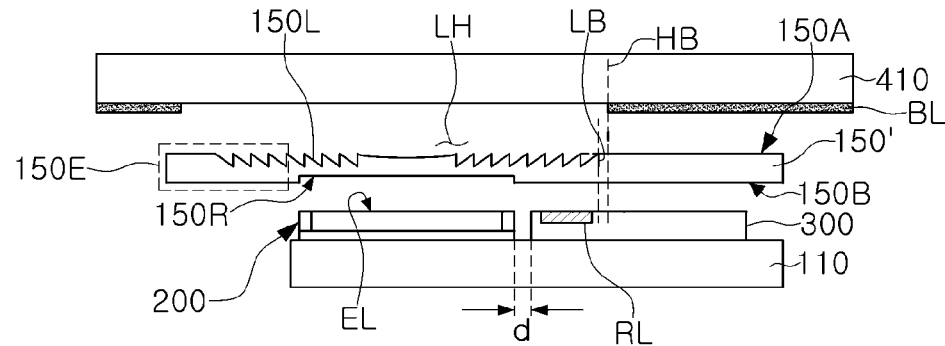
FIG. 9A is a cross-sectional diagram illustrating the flash LED module (in an assembled state) illustrated in FIG. 8.

FIG. 8 is an exploded perspective diagram illustrating a flash LED module according to another example embodiment, and FIG. 9A is a cross-sectional diagram illustrating the flash LED module (in an assembled state) illustrated in FIG. 8.

Referring to FIGS. 8 and 9A, a flash LED module 100A in the example embodiment may be similar to the flash LED module 100 illustrated in FIGS. 1 and 2A other than the position of the light sensor 300 relative to the lens and the structure of the module cover 150'. The elements in the example embodiment may be the same as or similar to the elements of the flash LED module 100 illustrated in FIGS. 1 and 2A unless otherwise indicated.

Similar to the aforementioned example embodiment, a light sensor 300 in the present example embodiment may be disposed adjacent to a LED package 200, and a light receiving region RL may be disposed on a region adjacent to the LED package 200 on an upper surface of the light sensor 300. In the present example embodiment, the lens 150L overlaps an entirety of the light receiving region RL of the light sensor 300.

That is, assuming a boundary line LB at the outer edge of the lens 150L extends in a direction perpendicular to the substrate 110, the entirety of the light receiving region RL may be disposed within the boundary line LB. In the arrangement, light of the LED package 200 may be externally emitted and ambient light detected by the light sensor 300 may be received through a single transparent hole LH aligned with the lens 150L. For example, the transparent hole LH provided as an optical opening may be provided by a transparent hole structure 410 disposed in a housing of a device including a camera. For example, the transparent hole structure 410 may include an opaque film that forms light blocking layer BL in a region other than the transparent hole LH on one surface (e.g., a lower surface) of a transparent body casing of a device such as a smart phone. The transparent body casing may be a glass substrate. In this case, in the example embodiment, the light receiving region of the light sensor may be configured to be disposed within the boundary line LB of the transparent hole LH. In this case, the diameter of the transparent hole may be greater than the diameter of the lens.

As described above, in the example embodiment, the light sensor 300 may be arranged such that the overall light receiving region RL may overlap the lens 150L, thereby receiving ambient light through the lens 150L in an efficient manner.

Figure 9B:
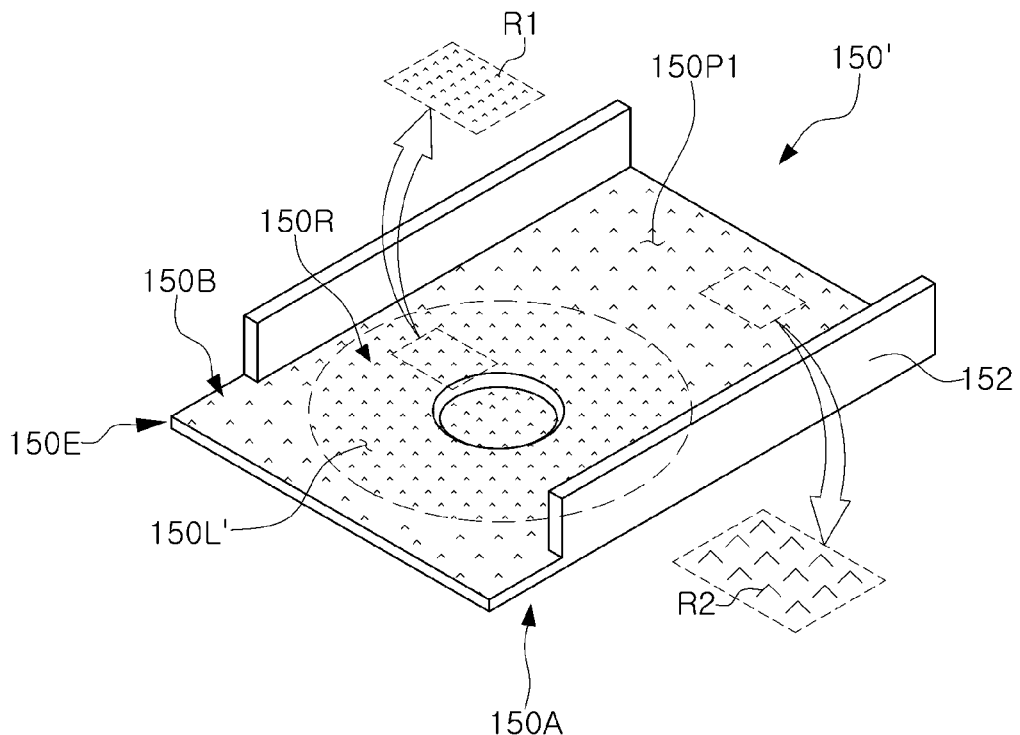
FIG. 9B is a perspective diagram illustrating a module cover of flash LED module illustrated in FIG. 8.

As illustrated in FIG. 9B, a lower surface 150B of the module cover 150 in the example embodiment may include a lower surface region 150L' of the lens 150L having a surface roughness R2 that is lower than a surface roughness R1 of a remaining lower surface region 150P1 of the module cover 150. As with the previous embodiment, a surface roughness R2 of the lower surface region 150L' of the lens 150L may be 0.1 µm or higher, and may be lower than a surface roughness R1 of the lower surface region 150P1. For example, the surface roughness R2 of the lower surface region 150L' of the lens 150L may be within a range of 0.1 µm to 1.0 µm, and a surface roughness R1 of the other lower surface region 150P1 of the module cover 150 may be 0.8 µm or higher.

The module cover 150 in the example embodiment may have a light incident region 150R have a central concavity that condenses light a region facing light emitting region EL of the LED package 200. The central concavity of the light incident region 150R be a cylindrical shape, a cut-out conical shape, a spherical shape, or combinations thereof.

A lower surface region 150L' of the lens 150L may include the concave light incident region 150R, and a surface roughness of the concave light incident region 150R may be within a range of 0.1 µm to 1.0 µm.

An upper surface 150A of the module cover 150 may be processed to be hazed similarly to the other lower surface region 150P1 of the module cover 150. As shown in FIG. 8, the other upper surface region 150P2 of the module cover 150 other than the lens 150L has a surface roughness R1 greater than a surface roughness R2. For example, a surface roughness R2 of the other upper surface region 150P1 of the module cover 150 other than the lens 150L may be 0.8 µm or greater.

The lens 150L may be configured to have an area greater than an area of the light emitting region EL. The module cover 150 may have a portion 150E extending externally of the substrate 110 to not overlap the substrate 110, and a portion of the lens 150L may be disposed in the extended portion 150E. The module cover 150 may have an area greater than an area of the substrate 110.

The module cover 150 may include a side wall structure 152 supporting a plate portion and mounted on the substrate 110. The side wall structure 152 in the example embodiment may include two side wall structures 152 disposed on both corners opposing each other and opened in a direction in which the LED package 200 and the light sensor 300 are arranged. As both side surfaces of the flash LED module 100A disposed in the arrangement direction are configured to be opened, the side surfaces may be provided as paths through which heat emitted from the LED package 200 is emitted.

Figure 10:
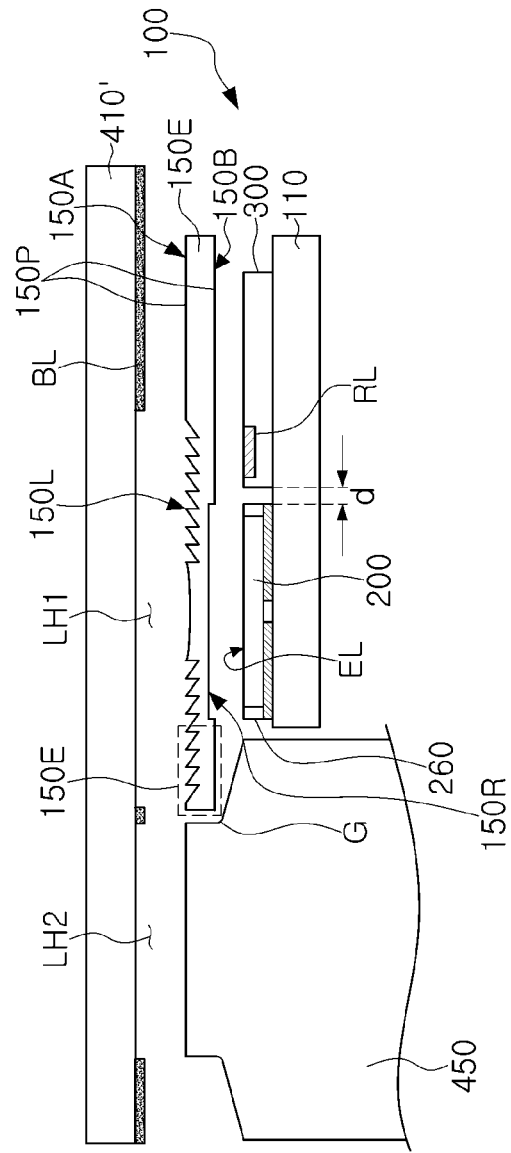
FIG. 10 is a perspective diagram illustrating the flash LED module illustrated in FIG. 9A combined with adjacent components.

As illustrated in FIG. 8, in the flash LED module 100A, as a substrate is not disposed below the extended portion of a lens cover B as illustrated in the cross-sectional diagram, an empty space may be present. When the flash LED module 100A is attached to a mobile device including a camera, the flash LED module and the other components may be disposed in a condense manner using the empty space. FIG. 10 is a perspective diagram illustrating a combined state in which the flash LED module illustrated in FIG. 9A is combined with adjacent components.

Referring to FIG. 10, a camera lens module 450 may be disposed adjacent to a LED package 200. For example, the other module may be configured as a camera lens module 450 having a barrel.

A barrel of the camera lens module 450 may have an upper end portion G having a decreasing width, and an extended portion 150E of a module cover 150 may be configured to be inserted into the upper end portion G such that the flash LED module 100A may be disposed adjacent to the camera lens module 450.

A transparent hole structure 410' illustrated in FIG. 10 may include a first transparent hole LH1 corresponding to the lens 150L of the flash LED module 100A and a second transparent hole LH2 for the camera lens module 450. As the flash LED module 100A is disposed adjacent to the camera lens module 450, the transparent hole structure 410' provided in a housing may have a single structure.

As described above, by modifying a structure of the module cover 150', a mobile device including a camera module in which components are disposed compactly may be provided.

In the example embodiment described above, the flash LED module may include the lens cover along with the flash LED device and the light sensor mounted on a single substrate, but an example embodiment thereof is not limited thereto. In another example embodiment, the lens cover may be mounted in a housing (e.g., an optical opening) of an upper level product (e.g., a mobile device) in advance, and the flash LED module may be provided as a module including the flash LED device and the light sensor mounted on a substrate without a lens cover.

Figure 11A:
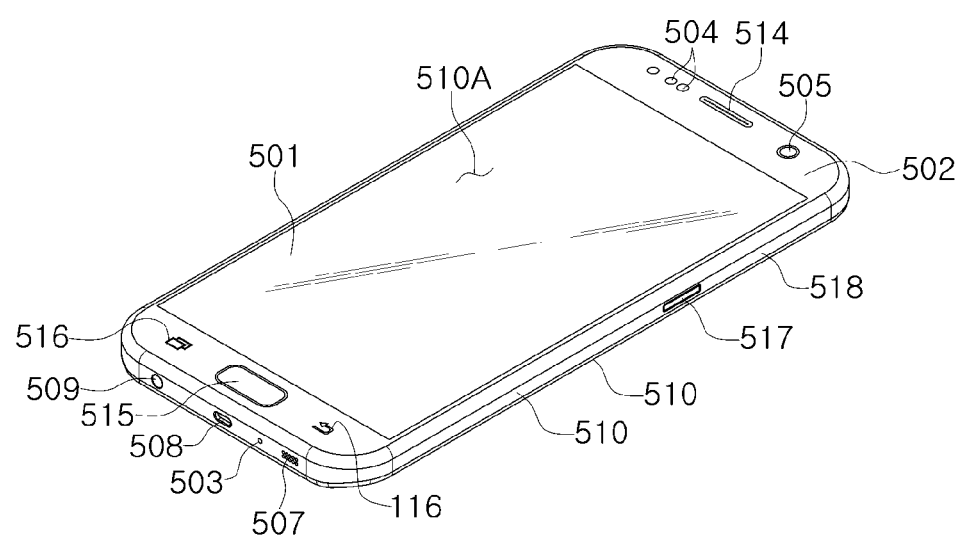
FIGS. 11A and 11B are perspective diagrams illustrating a front surface and a rear surface of a mobile device embedded in a camera, respectively, according to an example embodiment of the present inventive concept.
Figure 11B:
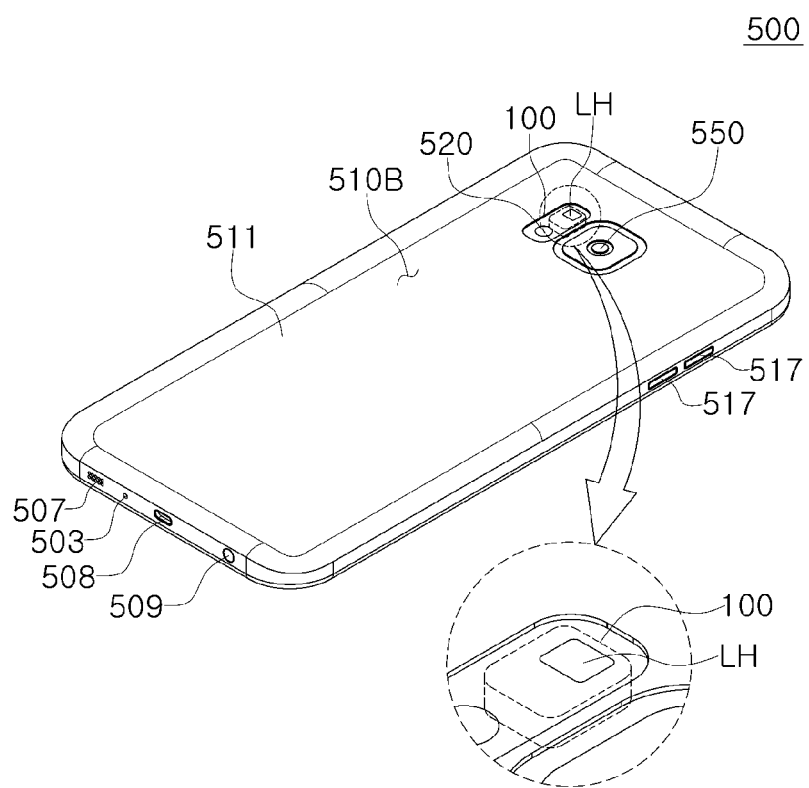

FIGS. 11A and 11B are perspective diagrams respectively illustrating a front surface and a rear surface of a mobile device (e.g., a smart phone) embedded with a camera according to an example embodiment.

Referring to FIGS. 11A and 11B, a mobile device 500 in the example embodiment may include a housing 510 including a first surface 510A (or a front surface), a second surface 510B (or a rear surface), and a side surface 510C surrounding a space between the first surface 510A and the second surface 510B.

In the example embodiment, at least a portion of the first surface 510A may be formed by a front plate 502 (e.g., formed using glass or polymer including a variety of coating layers) configured to be substantially transparent. The second surface 510B may be formed by a rear plate 511 configured to be substantially opaque. The rear plate 511 may be formed of coated or colored glass, ceramic, polymer, a metal, or combination of at least two or more of these materials. The side surface 510C may be combined with the front plate 502 and the rear plate 511, and may be formed by a side bezel structure 518 (or a side surface member) including a metal and/or polymer.

A mobile device 500 in the example embodiment may include at least one or more of a display 501, audio modules 503, 507, and 514, a sensor module 504, a plurality of camera modules 505 and 550, key input devices 515, 516, and 517, an indicator 506, and connector jacks 508 and 509. In example embodiments, in the mobile device 500 may include additional elements not shown, and one or more of the shown elements may be omitted.

The display 501 may be exposed through all or part of the front plate 502. Although not shown, the display 501 may be combined with or disposed adjacent to a touch sensing circuit, a pressure sensor measuring strength (pressure) of a touch, and/or a digitizer detecting a stylus pen based on a magnetic field.

Audio modules 503, 507, and 514 may include a microphone jack 503 and speaker jacks 507 and 514. A microphone may be plugged into the microphone jack 503 to obtain external sounds, and in example embodiments, a plurality of microphones may be disposed to sense a direction of sound. The speaker jacks 507 and 514 may include an external speaker jack 507 and a receiver jack 514 for use during a voice call. In example embodiments, the speaker jacks 507 and 514 and the microphone jack 503 may be integrated and implemented using a single jack, or speakers may be included without the speaker jacks 507 and 514.

The camera modules 505 and 550 may be disposed on a first surface 510A and a second surface 510B of the mobile device 500, respectively. The camera modules 505 and 550 may include a single lens or a plurality of lenses, an image sensor, and/or an image signal processor.

The sensor modules 504 and 520 may generate an electrical signal or a data value corresponding to an operational state of the mobile device 500 or an external environmental state. The sensor modules 504 and 520 may be configured as proximity sensors, for example. In the flash LED module 100, a light sensor and a flash LED device may be integrated with each other as in the embodiment described herein, and the flash LED module 100 may be disposed adjacent to a camera module 550. The mobile device 500 including the flash LED module 100, such as a mobile communication terminal, may correct a camera image or may control a light source of the mobile device 500 such as the LED package 200, or the like, based on information relating to flicker, color, and/or brightness obtained from ambient light received in the light sensor 300 of the flash LED module 100.

In the example embodiment, the flash LED module 100 may be disposed together with another sensor, but an example embodiment thereof is not limited thereto. Only the flash LED module 100 may be disposed without the other sensor module 520. The flash LED module 100 may provide flash light through a single hole LH configured as an optical opening as described above and may receive ambient light through the hole. In the example embodiment, the flash LED module 100 may only be disposed adjacent to the rear surface camera module 550, but an example embodiment thereof is not limited thereto. The flash LED module 100 may be configured to be integrated with a light sensor for the front surface camera module 505.

The key input devices 515, 516, and 517 may include a home key button 515 disposed on the first surface 510A of the housing 510, a touch pad 516 disposed around the home key button 515, and/or a side key button 517 disposed on the side surface 510C of the housing 510. In example embodiments, the mobile device 500 may not include portions of or all of the above-described elements, and may be configured to include another input means such as a soft key on the display 501 instead of the above-described elements.

The indicator 506 may be disposed on the first surface 510A of the housing 510. The indicator 506 may provide information of a state of the mobile device 500 in a form of light, and may include an LED. The connector jacks 508 and 509 may include the first connector jack 508 in which a connector (e.g., a USB connector) for transmitting power and/or data to or receiving power and/or data from an external electronic device is accommodated, and/or the second connector jack 509 (e.g., an earphone jack) in which a connector for transmitting an audio signal to or receiving an audio signal from an external electronic device is accommodated.

The flash LED module of the example embodiments may be applied to various types of electronic devices including a camera or an image sensor, as well as the mobile communication terminal described in the aforementioned example embodiments.

According to the aforementioned example embodiments, by disposing the light sensor to overlap the flash lens unit, flash light may be emitted and ambient light for calibrating a camera image may be received using a single hole arranged in a housing of a mobile device.

While example embodiments have been shown and described above, it will be apparent to those skilled in the art that modifications and variations could be made without departing from the scope of the present inventive concept as defined by the appended claims. As one example, the inventive concept of roughening one or more surfaces of the module over to form a visual impediment against viewing internal components of LED module is applicable to embodiments which omitted the light sensor within the LED module. In this case, the surface roughening would inhibit viewing of the LED package within the LED module.

Figure 12:
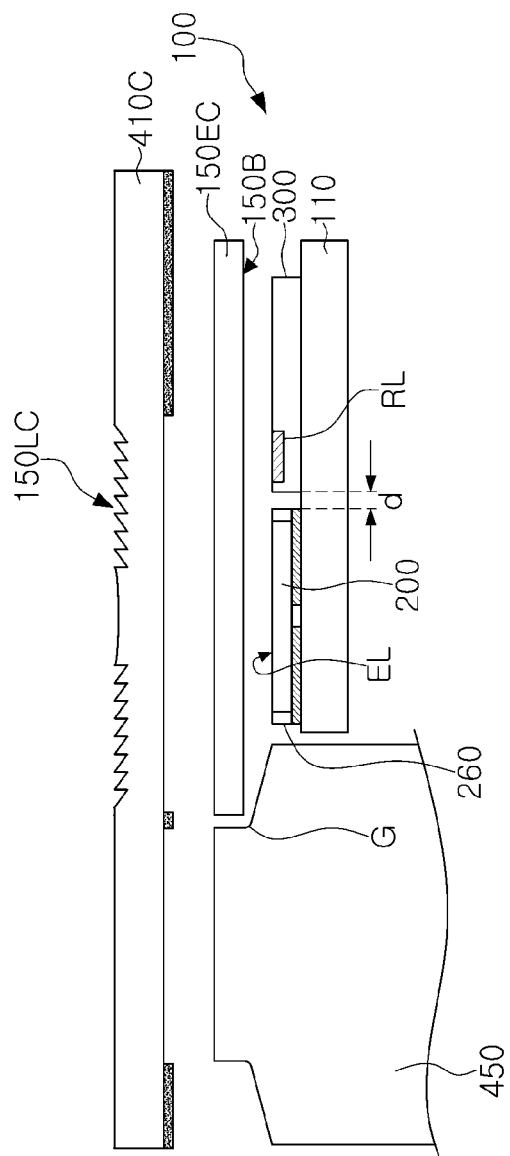
FIG. 12 is a cross-sectional diagram illustrating a flash LED module according to an example embodiment of the present inventive concept.

As another example, the lens that is shared by the LED package and the light sensor need not be formed in the module cover. That is, the lens can be located elsewhere either within or outside the module cover. FIG. 12 illustrates a modification of FIG. 10 in which the lens 150LC (such as a Fresnel lens) is formed within the light transparent region of the outer casing 410C of an electronic device such as a smart phone. In this case, the module cover 150C is optically transparent (with or without roughening) and does not include a lens as in the previous embodiments. All remaining elements of FIG. 12 are the same as those described previously in connection with FIG. 10.

What is claimed is:

1. A light emitting diode (LED) module comprising:
a substrate including an upper surface;
an LED package including a light emitting region and mounted on the upper surface of the substrate;
a light sensor including a light receiving region and mounted on the upper surface of the substrate horizontally adjacent the LED package; and
a lens vertically aligned over the light emitting region of the LED package and at least partially overlapping the light receiving region of the light sensor,
wherein the lens is a Fresnel lens and a center axis of the Fresnel lens is aligned with a geometric center of the light emitting region of the LED package.

2. The LED module of claim 1, wherein the LED package includes an LED chip and a wavelength conversion film configured to emit white light.

3. The LED module of claim 1, wherein the light sensor is an ambient light sensor, and the light receiving region of the light sensor includes a photodiode array.

4. The LED module of claim 1, wherein the lens entirely overlaps the light emitting region of the LED package and partially overlaps the light receiving region of the light sensor.

5. The LED module of claim 1, wherein an outer edge of the Fresnel lens is vertically aligned over the light receiving region of the light sensor.

6. The LED module of claim 1, wherein the Fresnel lens has a field-of-view (FOV) of at least 100°.

7. The LED module of claim 1, wherein a lower surface of the Fresnel lens includes a central light condensing concavity located over the light emitting region of the LED package.

8. The LED module of claim 1, wherein the LED package includes a reflective sidewall interposed between the light emitting region and the light sensor.

9. The LED module of claim 8, wherein the reflective wall of the LED package surrounds the light emitting region of the LED package.

10. The LED module of claim 1, wherein a horizontal spacing between the LED package and the light sensor is 300 μm or less.

11. The LED module of claim 1, further comprising a module cover extending over the substrate and defining an upper wall of the LED module, wherein the lens is formed in the module cover.

12. The LED module of claim 11, wherein a lower surface of the module cover is roughened to form a visual impediment of the LED package and the light sensor when viewed through the module cover.

13. A light emitting diode (LED) module comprising:
a substrate including an upper surface;
an LED package including a light emitting region and mounted on the upper surface of the substrate;
an ambient light sensor including a light receiving region and mounted on the upper surface of the substrate horizontally adjacent the LED package; and
a module cover formed of light transparent material and extending over the substrate to define an upper wall of the LED module, a portion of the module cover including a Fresnel lens vertically aligned over the light emitting region of the LED package and at least partially overlapping the light receiving region of the ambient light sensor,
wherein the LED package includes an LED chip and a wavelength conversion film located over the LED chip and configured to emit white light, and
wherein the LED package further includes a reflective structure having vertical sidewalls surrounding the LED chip and the wavelength conversion film to inhibit light emission from side surfaces of the LED chip and the wavelength conversion film.

14. The LED module of claim 13, wherein the reflective structure is formed of a resin material including a reflective powder.

15. The LED module of claim 13, wherein the LED package further includes a light transmitting film located over the wavelength conversion film, and wherein the vertical sidewalls further surround the light transmitting film to inhibit light emission from side surfaces of the light transmitting film.

16. A light emitting diode (LED) module comprising:
a substrate including an upper surface;
a flash LED package including a light emitting region and mounted on the upper surface of the substrate, the light emitting region configured to emit a light flash for a camera; and
a module cover formed of a transparent material and extending over the substrate to define an upper wall of the LED module, a portion of the module cover includes a lens aligned over the light emitting region of the LED package, wherein the lens includes a Fresnel lens structure formed on an upper surface of the module cover, and wherein a lower surface of at least the lens of the module cover is roughened to form a visual impediment against viewing the LED package through the lens from outside the module cover.

17. The LED module of claim 16, further comprising an ambient light sensor mounted on the upper surface of the substrate horizontally adjacent the flash LED package.

* * * * *